United States Patent
Naffziger et al.

(10) Patent No.: US 7,068,081 B2
(45) Date of Patent: Jun. 27, 2006

(54) FREQUENCY SYNTHESIZER WITH DIGITAL PHASE SELECTION

(75) Inventors: Samuel David Naffziger, Fort Collins, CO (US); Shahram Ghahremani, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 135 days.

(21) Appl. No.: 10/838,395

(22) Filed: May 4, 2004

(65) Prior Publication Data

US 2005/0248373 A1    Nov. 10, 2005

(51) Int. Cl.
*H03B 21/00* (2006.01)

(52) U.S. Cl. ........................... 327/105; 327/114
(58) Field of Classification Search .............. None
See application file for complete search history.

(56) References Cited

U.S. PATENT DOCUMENTS

| | | | | |
|---|---|---|---|---|
| 5,059,924 A * | 10/1991 | JenningsCheck | ............ | 331/1 A |
| 5,394,116 A * | 2/1995 | Kasturia | ................. | 331/34 |
| 5,970,110 A * | 10/1999 | Li | ................. | 377/48 |
| 6,157,694 A * | 12/2000 | Larsson | ................. | 377/48 |
| 6,249,189 B1 * | 6/2001 | Wu et al. | ................. | 331/18 |
| 6,583,674 B1 * | 6/2003 | Melava et al. | ................. | 331/16 |
| 6,844,785 B1 * | 1/2005 | Chiang et al. | ................. | 331/1 A |

\* cited by examiner

*Primary Examiner*—Minh Nguyen

(57) ABSTRACT

Systems, methodologies, media, and other embodiments associated with making a frequency change through frequency synthesis and digital selection of out-of-phase synthesized signals are described. One exemplary system embodiment includes a locked loop logic (e.g., phase locked, delay locked) that may receive a reference clock signal, process the reference clock signal into signals with different phases, and make those signals available to a selection logic. The exemplary system may also include a state logic that stores frequency divisors that facilitate selecting and tracking output signals provided by the selection logic. The exemplary system may also include a phase logic that stores output signal phase data associated with computing, describing, and/or selecting an output signal.

14 Claims, 5 Drawing Sheets

FREQUENCY SYNTHESIZER WITH DIGITAL PHASE SELECTION

BACKGROUND

Power in a CMOS (complimentary metal oxide semiconductor) circuit can be characterized by:

$$P = c \times v^2 \times f \qquad (1)$$

where P=power, c=switching capacitance, v=supply voltage, and f=switching frequency. Since power consumption is a criteria evaluated in designing conventional circuits, and since changing the supply voltage yields a quadratic effect on power consumption, supply voltage is frequently manipulated in circuits in an attempt to conserve power. For example, supply voltage may be reduced when a processor enters a "sleep" or "standby" mode. However, switching frequency in CMOS is typically directly proportional to supply voltage. Thus, the switching frequency changes as the supply voltage changes. For example, as the supply voltage decreases the switching frequency should also decrease.

To achieve an average chip frequency higher than the frequency associated with the minimum voltage across a chip over time, it is necessary to quickly adapt (e.g., reduce) cycle time in response to a voltage drop created when the supply voltage is manipulated (e.g., when chip goes into a power saving mode). Traditional clock generators like phase locked loops (PLL) and delay locked loops (DLL) do not satisfactorily adapt the cycle time due, for example, to locking time delays. In one example, when the output frequency of a typical PLL changes, there is a relatively long (e.g., milliseconds) wait for the PLL to get locked. Additionally, due to process, voltage, and temperature variations, the PLL lock time may be unpredictable. In another example, an open loop voltage controlled oscillator (VCO) running off a chip supply may rapidly adapt its frequency to voltage changes. However, its frequency is unpredictable from part to part, even for substantially identical chip behavior.

BRIEF DESCRIPTION OF THE DRAWINGS

The accompanying drawings, which are incorporated in and constitute a part of the specification, illustrate various example systems, methods, and so on that illustrate various example embodiments of aspects of the invention. It will be appreciated that the illustrated element boundaries (e.g., boxes, groups of boxes, or other shapes) in the figures represent one example of the boundaries. One of ordinary skill in the art will appreciate that one element may be designed as multiple elements or that multiple elements may be designed as one element. An element shown as an internal component of another element may be implemented as an external component and vice versa. Furthermore, elements may not be drawn to scale.

DETAILED DESCRIPTION

Figure 1:
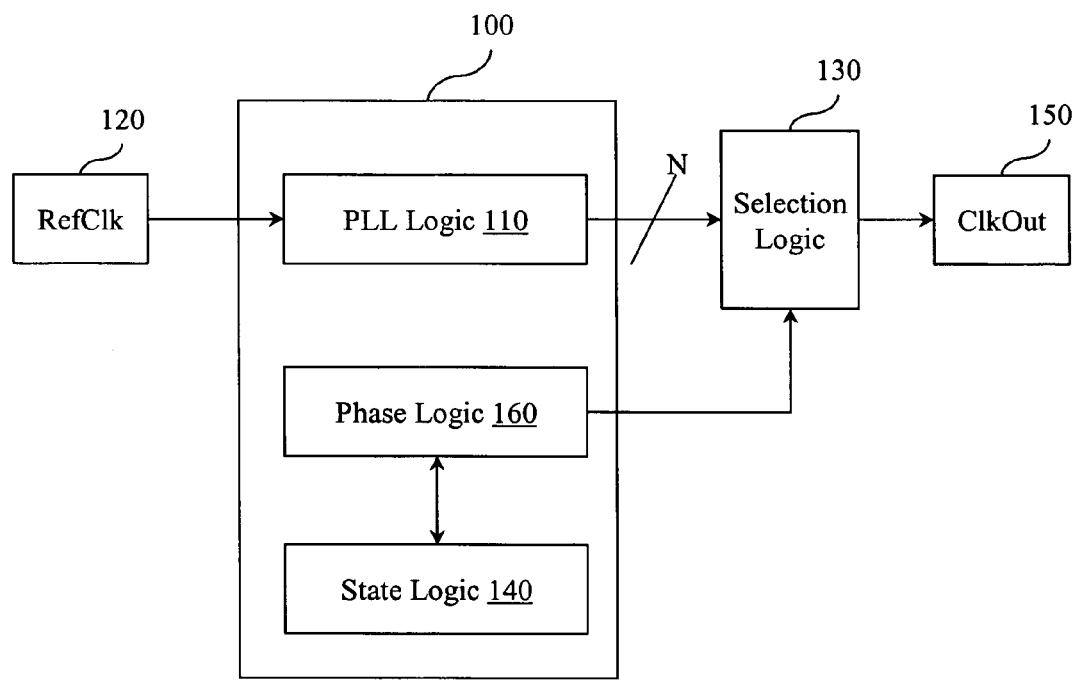
FIG. 1 illustrates an example system that facilitates responding within a single reference clock cycle to a voltage drop in an integrated circuit in order to facilitate achieving a frequency in the integrated circuit that is higher than the frequency associated with the minimum voltage across the integrated circuit.

The following includes definitions of selected terms employed herein. The definitions include various examples and/or forms of components that fall within the scope of a term and that may be used for implementation. The examples are not intended to be limiting. Both singular and plural forms of terms may be within the definitions.

"Computer-readable medium", as used herein, refers to a medium that participates in directly or indirectly providing signals, instructions and/or data. A computer-readable medium may take forms, including, but not limited to, non-volatile media, volatile media, and transmission media. Non-volatile media may include, for example, optical or magnetic disks and so on. Volatile media may include, for example, optical or magnetic disks, dynamic memory and the like. Transmission media may include coaxial cables, copper wire, fiber optic cables, and the like. Transmission media can also take the form of electromagnetic radiation, like that generated during radio-wave and infra-red data communications, or take the form of one or more groups of signals. Common forms of a computer-readable medium include, but are not limited to, a floppy disk, a flexible disk, a hard disk, a magnetic tape, other magnetic medium, a CD-ROM, other optical medium, punch cards, paper tape, other physical medium with patterns of holes, a RAM, a ROM, an EPROM, a FLASH-EPROM, or other memory chip or card, a memory stick, a carrier wave/pulse, and other media from which a computer, a processor or other electronic device can read. Signals used to propagate instructions or other software over a network, like the Internet, can be considered a "computer-readable medium."

"Data store", as used herein, refers to a physical and/or logical entity that can store data. A data store may be, for example, a database, a table, a file, a list, a queue, a heap, a memory, a register, and so on. A data store may reside in one logical and/or physical entity and/or may be distributed between two or more logical and/or physical entities.

"Logic", as used herein, includes but is not limited to hardware, firmware, software and/or combinations of each to perform a function(s) or an action(s), and/or to cause a function or action from another logic, method, and/or system. For example, based on a desired application or needs, logic may include a software controlled microprocessor, discrete logic like an application specific integrated circuit (ASIC), a programmed logic device, a memory device containing instructions, or the like. Logic may include one or more gates, combinations of gates, or other circuit components. Logic may also be fully embodied as software. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, and/or logical communications may be sent and/or received. Typically, an operable connection includes a physical interface, an electrical interface, and/or a data interface, but it is to be noted that an operable connection may include differing combinations of these or other types of connections sufficient to allow operable control. For example, two entities can be operably connected by being able to communicate signals to each other directly or through one or more intermediate entities like a processor, operating system, a logic, software, or other entity. Logical and/or physical communication channels can be used to create an operable connection.

"Signal", as used herein, includes but is not limited to one or more electrical or optical signals, analog or digital signals, data, one or more computer or processor instructions, messages, a bit or bit stream, or other means that can be received, transmitted and/or detected.

"User", as used herein, includes but is not limited to one or more persons, software, computers or other devices, or combinations of these.

Some portions of the detailed descriptions that follow are presented in terms of algorithms and symbolic representations of operations on data bits within a memory. These algorithmic descriptions and representations are the means used by those skilled in the art to convey the substance of their work to others. An algorithm is here, and generally, conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic and the like.

It has proven convenient at times, principally for reasons of common usage, to refer to these signals as bits, values, elements, symbols, characters, terms, numbers, or the like. It should be borne in mind, however, that these and similar terms are to be associated with the appropriate physical quantities and are merely convenient labels applied to these quantities. Unless specifically stated otherwise, it is appreciated that throughout the description, terms like processing, computing, calculating, determining, displaying, or the like, refer to actions and processes of a computer system, logic, processor, or similar electronic device that manipulates and transforms data represented as physical (electronic) quantities.

FIG. 1 illustrates a system 100 that facilitates responding to a voltage drop in an integrated circuit in order to facilitate achieving a frequency in the integrated circuit that is higher than the frequency associated with the minimum voltage across the integrated circuit. The system 100 may include, a phase locked loop (PLL) logic 110. While a phase locked loop logic 110 is described, it is to be appreciated that other locked loop logics (e.g., delay locked loop) may be employed. The PLL logic 110 may receive a reference signal from a reference clock 120 and process the reference signal into a set of N signals that have mutually exclusive phases. The PLL logic 110 may then make the set of N signals available to a selection logic 130 (e.g., an N:1 multiplexer). In one example, the PLL logic 110 may create sixty-four equal phases of the same reference signal. The sixty-four equal phases may have the same frequency but may have mutually exclusive phase shifts, differing from each other by 1/64th of a cycle of the reference signal. In one example, the PLL logic 110 may divide down the reference signal in increments of 1/64 using, for example, a phase multiplexing technique. While 64 phases are described, it is to be appreciated that more generally a signal Sn that is a member of the set of N signals is phase shifted by (n/N) of a cycle from the reference signal, N and n being integers, and n having a range of 0 to (N−1).

The system 100 may also include a state logic 140 that is configured to track state for the system 100. In one example, the state logic 140 tracks state by storing frequency division data. For example, the state logic 140 may store a first frequency divisor associated with a first signal selected by the selection logic 130 to be provided as an output signal (e.g., ClkOut 150). The frequency divisor can facilitate selecting one of the out of phase signals to effectively change the frequency of the ClkOut signal 150. The state logic 140 may also store a second frequency divisor associated with a second signal that is going to be the next signal selected by the selection logic 130 to be provided as an output signal. By selecting a first signal S1 that is out of phase from the reference clock by a first amount, and then selecting a second signal S2 that is out of phase from the reference clock by a second, different amount, the system 100 can rapidly (e.g., faster than possible using conventional PLL or DLL techniques) change the frequency of the ClkOut signal 150 without incurring a conventional PLL lock time delay. In one example, the system 100 may have a lock time of one clock cycle of the reference signal. In another example, the system 100 may have a lock time less than 1 microsecond.

The system 100 may also include a phase logic 160 that is configured to track state for the system 100. In one example, the phase logic 160 tracks state by storing phase shift data. For example, the phase logic 160 may store a current phase shift data that is associated with a current ClkOut signal 150. Furthermore, the phase logic 160 may be configured to determine a phase shift data that facilitates selecting a next ClkOut signal 150. The phase shift data for selecting the next ClkOut signal 150 may be based, for example, on the second frequency divisor and the current phase shift data. The phase shift data for selecting the next ClkOut signal 150 may facilitate producing a frequency change in the ClkOut signal 150 by switching from the current output signal that has one phase shift to the next output signal that has a different phase shift. If the next output signal phase "lags" behind the current output signal, then the frequency will appear to decrease. If the next output signal phase "runs ahead" of the current output signal then the frequency will appear to increase. The amount by which the frequency of the ClkOut signal 150 can be increased/decreased can be manipulated by choosing various signals with different relative phase shifts.

In one example, the phase logic 160 may determine the next phase shift data according to Phase(t+1)=Phase (t)+M, where t is the clock phase number, Phase (t) is the current clock output signal phase, Phase (t+1) is the next clock output signal phase, and M is the second frequency divisor. One skilled in the art will appreciate that logic for making this determination (e.g., implementing a state machine) may be implemented in hardware, which facilitates achieving the one reference clock cycle switching time.

The selection logic 130 may be, for example, a multiplexer. Thus, the phase logic 160 may be configured to control the multiplexer to provide a clock output signal with a frequency determined according to:

$$Fout = Fmax * (N/(N+m))$$

where Fout is the clock signal provided by the selection logic, Fmax is the reference clock signal, N is the number of signals into which Fmax is divided down, and m is the first frequency divisor, m being an integer in the range 0 to (N−1).

In one example, the system 100 may be implemented as a frequency synthesizer with digital phase selection and single cycle ratio change capability. This implementation may be referred to as a digital frequency divider.

Figure 2:
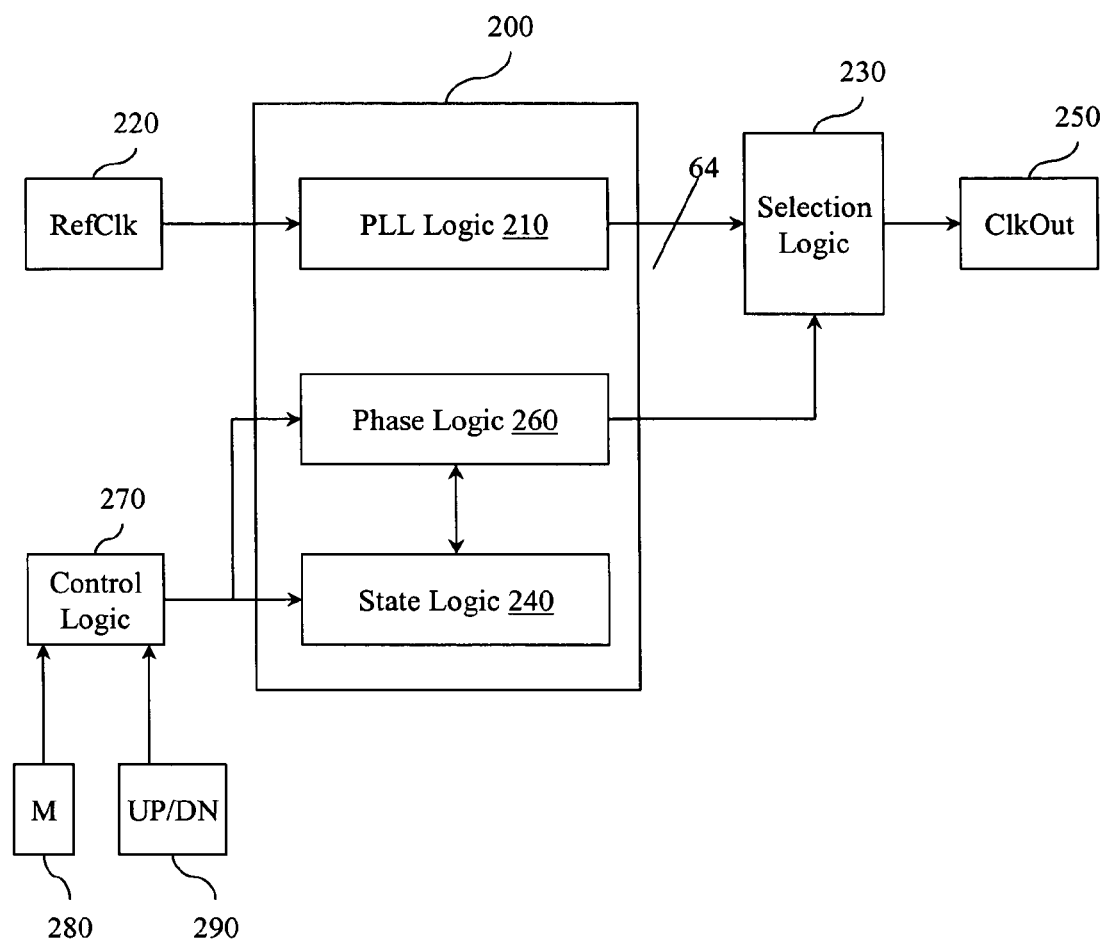
FIG. 2 illustrates an example system for making a frequency change through frequency synthesis and digital selection of out-of-phase synthesized signals.

FIG. 2 illustrates an example system 200 for creating a frequency change in an output signal using frequency synthesis and digital selection of synthesized signals. The system 200 may include a PLL logic 210, a phase logic 260, and a state logic 240 similar to those described in connection with system 100 (FIG. 1). As described above, while a phase locked loop logic 210 is described, it is to be appreciated that other locked loop logics (e.g., delay locked loop) may be employed. Similarly, the system 200 may receive a signal from a reference clock 220, interact with a selection logic 230, and produce a ClkOut signal 250 similar to those described in connection with system 100 (FIG. 1). In one example, the system 200 may provide sixty-four signals to the selection logic 230. Thus, the selection logic 230 may be, for example, a 64:1 multiplexer.

Additionally, the system 200 may include a control logic 270 that is configured to receive a frequency divisor control signal. The frequency divisor control signal may facilitate establishing a value for a frequency divisor. For example, the frequency divisor control signal may facilitate establishing and/or manipulating a frequency divisor signal for a current ClkOut signal 250 and for a next ClkOut signal 250. In one example, the frequency divisor control signal may be a discrete divisor signal M 280 that facilitates establishing a discrete value for a frequency divisor. For example, a value of seventeen may be entered through the signal M 280 and thus a frequency divisor may be set to that value. In another example, the frequency divisor control signal is a divisor up/down signal 290. The up/down signal 290 may be employed, for example, to increment or decrement a frequency divisor. Changing the frequency divisor facilitates controlling the selection logic 230 to rapidly switch between the N signals available to it. Since the N signals have the same frequency and have mutually exclusive phase shifts, switching between the signals can change the frequency of the ClkOut signal 250.

Thus, system 200 facilitates performing on-the-fly frequency conversions, which in turn facilitates dynamically changing the ClkOut signal 250 without incurring a PLL lock time delay. Therefore, in a system with a 1 GHz processor, one example system 200 may perform a frequency change in less than a nanosecond. Furthermore, the control logic 270 facilitates digitally selecting a signal at the selection logic 230, which in turn facilitates the single output cycle loop selection.

Figure 3:
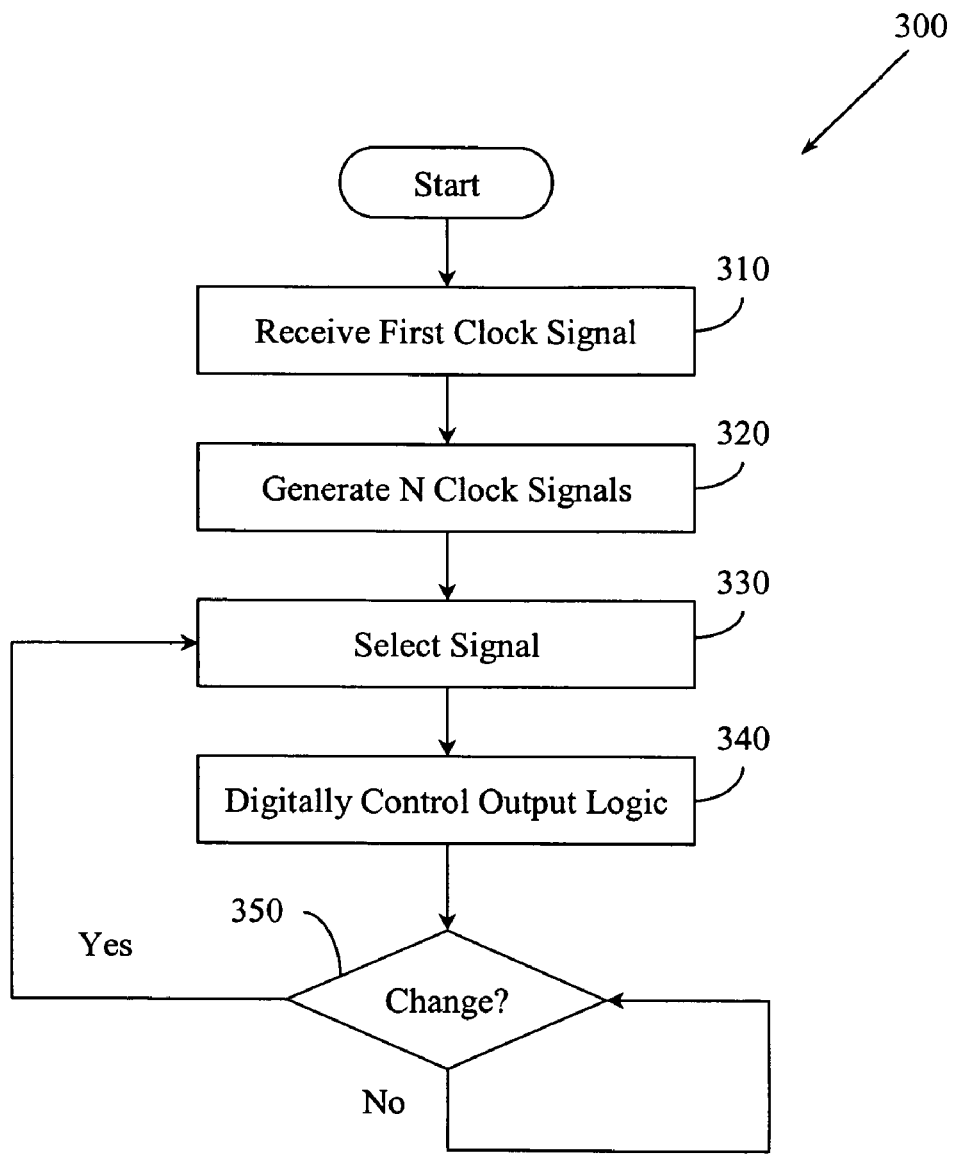
FIG. 3 illustrates an example method for responding to a voltage drop in an integrated circuit to facilitate achieving an average frequency in the integrated circuit higher than the frequency associated with the minimum voltage across the integrated circuit.
Figure 4:
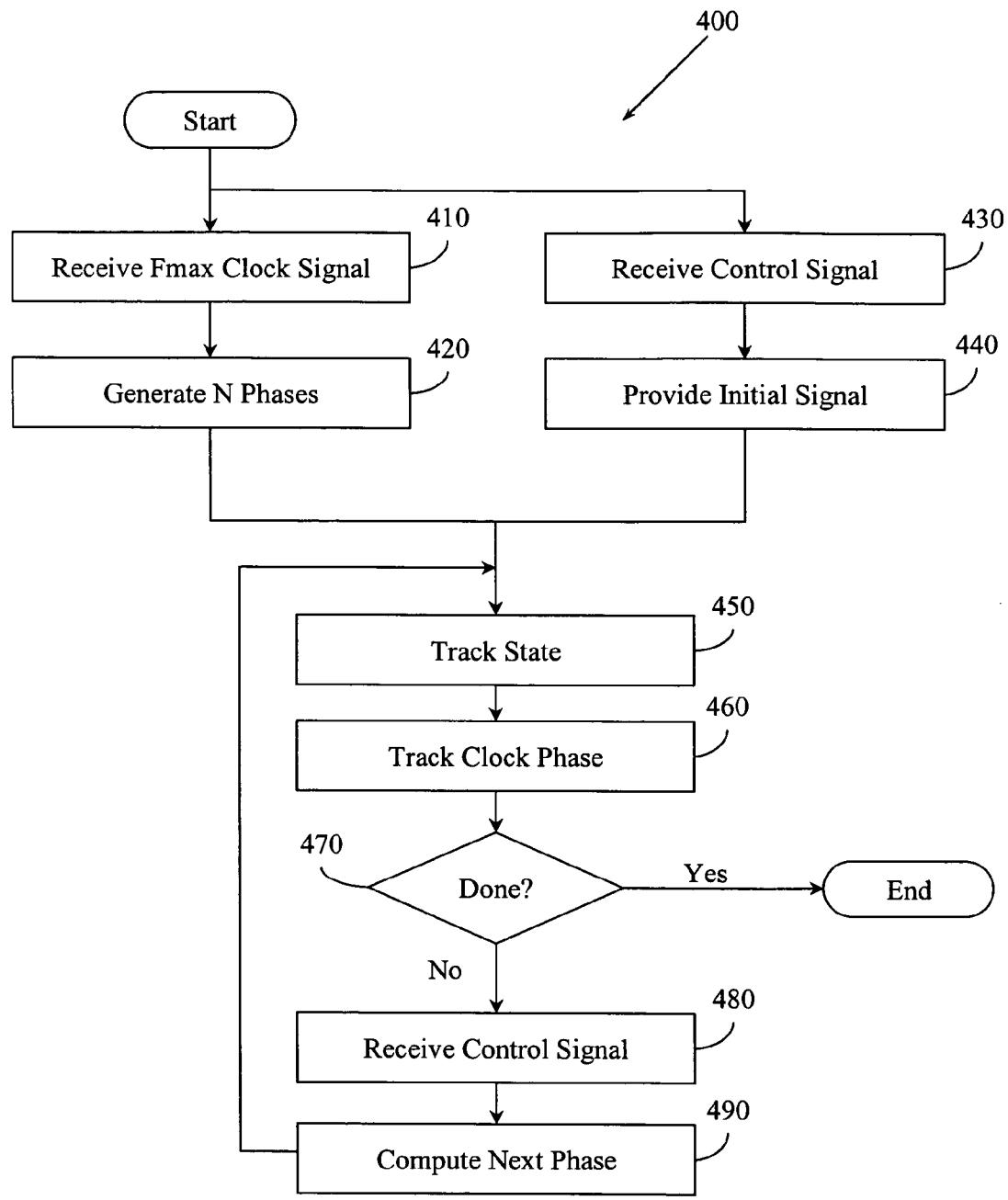
FIG. 4 illustrates an example method for changing the frequency of an output clock signal derived from and related to a reference clock signal whose frequency is related to the supply voltage.

Example methods may be better appreciated with reference to the flow diagrams of FIGS. 3 and 4. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Furthermore, additional and/or alternative methodologies can employ additional, not illustrated blocks.

In the flow diagrams, blocks denote "processing blocks" that may be implemented with logic. The processing blocks may represent a method step and/or an apparatus element for performing the method step. A flow diagram does not depict syntax for any particular programming language, methodology, or style (e.g., procedural, object-oriented). Rather, a flow diagram illustrates functional information one skilled in the art may employ to develop logic to perform the illustrated processing. It will be appreciated that in some examples, program elements like temporary variables, routine loops, and so on are not shown. It will be further appreciated that electronic and software applications may involve dynamic and flexible processes so that the illustrated blocks can be performed in other sequences that are different from those shown and/or that blocks may be combined or separated into multiple components. It will be appreciated that the processes may be implemented using various programming approaches like machine language, procedural, object oriented and/or artificial intelligence techniques.

FIG. 3 illustrates an example method 300 for quickly responding to a voltage drop across an integrated circuit in order to facilitate achieving a chip frequency for the integrated circuit that is higher than the frequency associated with the minimum voltage across the integrated circuit. The method 300 may include, at 310, receiving a first clock signal. The first clock signal may be, for example, a reference clock signal provided to several components in the integrated circuit. In one example, the first clock signal may be received from a component that is participating in on-die chip sharing (ODCS).

The method 300 may proceed, at 320, to generate a set of N signals from the first clock signal. For example, the first clock signal may be divided down into the N signals. The signals may have mutually exclusive phases. In one example, four signals with equal frequencies but mutually exclusive phases may be produced while in other examples, eight, sixteen, thirty-two, sixty-four, or one hundred and twenty-eight signals with substantially equal frequencies but mutually exclusive phases may be produced. It is to be appreciated that more generally the set of N signals may have various sizes. A member Sn of the set of N signals may be phase shifted by (n/N) of a cycle from the first clock signal, where n is an integer in the range 0 to (N−1).

Thus, a set of N signals, each with different phases but similar frequencies, is available to facilitate quickly responding to a voltage drop across an integrated circuit. One way that method 300 can respond to a voltage drop is, at 330, to select one of the signals to be provided as an output signal. By selecting different signals whose phases lag behind or run ahead of the reference clock signal, the frequency of an output signal derived from the reference clock signal can be increased and/or decreased, depending on the frequency of the currently selected output signal. Thus, in one example, the next output signal phase may be determined by:

$$\text{Phase}(t+1)=\text{Phase}(t)+M$$

where t is the current clock phase number, Phase (t) is the current clock phase, Phase (t+1) is the next clock phase, and M is a frequency divisor, M being an integer in the range 0 to (N−1).

Having selected the next clock phase, the method 300 may then proceed, at 340, to digitally control a clock output signal selection logic (e.g., multiplexer) to change which of the available signals in the set of N signals it provides as an output signal. In one example, the digital control facilitates changing between signals within a time period not greater than one cycle of the first clock signal. Thus, the change may, in one example, be performed in less than one microsecond.

If the clock output signal selection logic is a multiplexer, then it can be controlled to provide an output signal with a frequency corresponding to:

$$Fout = Fmax * (N/(N+m))$$

where Fout is the output signal provided by the clock output signal selection logic, Fmax is the first clock signal, N is the number of signals into which Fmax is divided down, and m is a frequency divisor, m being an integer in the range 0 to (N−1).

While FIG. 3 illustrates various actions occurring in serial, it is to be appreciated that various actions illustrated in FIG. 3 could occur substantially in parallel. By way of illustration, a first process could receive the first clock signal, a second process could generate the N clock signals, a third process could select the next output phase, and a fourth signal could control an output signal selection logic. While four processes are described, it is to be appreciated that a greater and/or lesser number of processes could be employed and that lightweight processes, regular processes, threads, and other approaches could be employed. It is to be appreciated that other example methods may, in some cases, also include actions that occur substantially in parallel.

FIG. 4 illustrates an example method 400 for changing the frequency of an output clock signal derived from and related to a reference clock signal whose frequency is related to the supply voltage. The method 400 may include, at 410, receiving a reference clock signal Fmax from the reference clock. The frequency of the Fmax signal may be the maximum frequency at which a circuit can be clocked.

At 420, the method 400 may generate N different signals from Fmax, where each of the N signals has a different phase. In one example, this may be accomplished using a phase multiplexing technique that produces the N different signals, each phase being shifted by (n/N) of a cycle from the phase of Fmax. The N signals may all have the same frequency, which may be some fraction of Fmax (e.g., Fmax/2). With the N different signals available, the method 400 may be able to create output frequency changes by providing different members of the N signals as an output signal.

Thus, the method 400 may include, at 430, receiving a first control signal that facilitates establishing an initial frequency divisor m. The frequency divisor m may in turn facilitate selecting and/or producing a first output clock signal with a first frequency. The frequency may be established by selecting in turn between various members of the set of N signals. Therefore, the method 400 may include, at 440, providing the first output clock signal with a frequency characterized by Fout=Fmax*(N/(N+m)), m being an integer in the range 0 to (N−1). Providing the first output clock signal may include, on a per reference clock signal basis, digitally controlling a logic that can select from the N available signals to produce an output signal with a desired frequency.

The method 400 may continue, at 450, by tracking state, because which of the N signals is selected next depends on which of the N signals was selected previously. The state may be tracked by tracking the frequency divisor m that is currently being used to select a signal from the set of N signals. At 460, the phase of the signal being employed to produce the output signal with the desired frequency may also be tracked. Tracking the frequency divisor m and/or phase of the signal may include, for example, storing a data value (e.g., current value of m, next value of m, current phase shift number) in a data store.

At 470, a determination is made concerning whether output clock signal synthesis is complete. If so, then the method 400 may terminate. Otherwise, the method 400 may continue. At 480, another control signal may be received. The control signal may facilitate establishing a second frequency divisor m' that facilitates providing a second output clock signal with a second frequency determined according to Fout=Fmax*(N/N+m')). The second frequency divisor facilitates selecting a signal from the N available signals whose phase shift is determined, at 490, according to Ph(t+1)=Phase (t)+m'. Thus, the second control signal facilitates controlling the clock output frequency by selecting which signal derived from the reference clock signal will be employed, with the decision being based, at least in part, on the phase of the signal derived from the reference clock signal.

In one example, the output signal control logic may be digitally controlled to switch between providing different output clock signals based on different signals with different phases, where the switch is made within a single cycle of Fmax.

In one example, methodologies are implemented as processor executable instructions and/or operations stored on a computer-readable medium. Thus, in one example, a computer-readable medium may store processor executable instructions operable to perform a method that includes receiving a first clock signal, generating a set of N second signals from the first clock signal by processing the first clock signal into divided down signals, where the divided down signals have mutually exclusive phases, and digitally controlling a clock output signal logic to change, within a time period not greater than one cycle of the first clock signal, from providing a first output signal derived from a member of the set of N second signals to providing a second output signal derived from the set of N second signals.

While the above method is described being stored on a computer-readable medium, it is to be appreciated that other example methods described herein can also be stored on a computer-readable medium.

Figure 5:
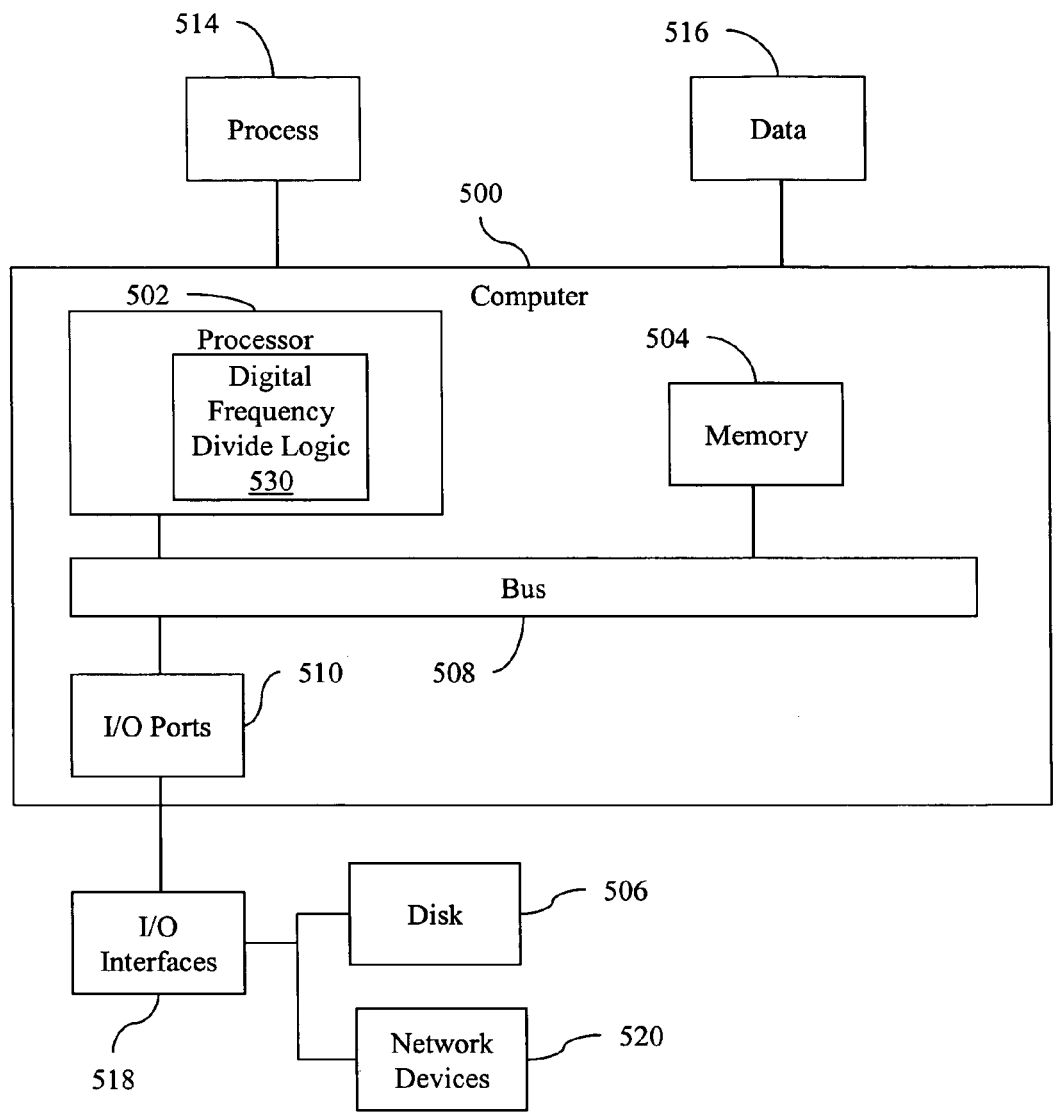
FIG. 5 illustrates an example computing environment in which example systems and methods illustrated herein can operate.

FIG. 5 illustrates a computer 500 that includes a processor 502, a memory 504, and input/output ports 510 operably connected by a bus 508. In one example, the computer 500 may include a digital frequency divide (DFD) logic 530 that is configured to facilitate frequency synthesizing with digital phase selection and single cycle ratio change capability. While the DFD logic 530 is illustrated inside processor 502, it is to be appreciated that in one example the DFD logic 530 may be operably connected to rather than located inside the processor 502. Similarly, it is to be appreciated that other components in the computer 500 may also include and/or be operably connected to a DFD logic. Thus, the DFD logic 530, whether implemented in computer 500 as hardware, firmware, software, and/or a combination thereof may provide means for producing a plurality of divided down phase-shifted signals from an input reference clock signal, means for selecting a divided down phase-shifted signal from the plurality of divided down phase-shifted signals, and means for establishing an output clock signal phase and state. The output clock signal may be selected from the plurality of divided down phase-shifted signals. The computer 500 may also include means for digitally changing the output clock signal phase and state within one cycle of the input reference clock signal.

The processor 502 can be a variety of various processors including dual microprocessor and other multi-processor architectures. The memory 504 can include volatile memory and/or non-volatile memory. The non-volatile memory can include, but is not limited to, ROM, PROM, EPROM, EEPROM, and the like. Volatile memory can include, for example, RAM, synchronous RAM (SRAM), dynamic RAM (DRAM), synchronous DRAM (SDRAM), double data rate SDRAM (DDR SDRAM), and direct RAM bus RAM (DRRAM).

A disk 506 may be operably connected to the computer 500 via, for example, an input/output interface (e.g., card, device) 518 and an input/output port 510. The disk 506 can include, but is not limited to, devices like a magnetic disk drive, a solid state disk drive, a floppy disk drive, a tape drive, a Zip drive, a flash memory card, and/or a memory stick. Furthermore, the disk 506 can include optical drives like a CD-ROM, a CD recordable drive (CD-R drive), a CD rewriteable drive (CD-RW drive), and/or a digital video ROM drive (DVD ROM). The memory 504 can store processes 514 and/or data 516, for example. The disk 506 and/or memory 504 can store an operating system that controls and allocates resources of the computer 500.

The bus 508 can be a single internal bus interconnect architecture and/or other bus or mesh architectures. While a single bus is illustrated, it is to be appreciated that computer 500 may communicate with various devices, logics, and peripherals using other busses that are not illustrated (e.g., PCIE, SATA, Infiniband, 1394, USB, Ethernet). The bus 508 can be of a variety of types including, but not limited to, a memory bus or memory controller, a peripheral bus or external bus, a crossbar switch, and/or a local bus. The local bus can be of varieties including, but not limited to, an industrial standard architecture (ISA) bus, a microchannel architecture (MSA) bus, an extended ISA (EISA) bus, a peripheral component interconnect (PCI) bus, a universal serial (USB) bus, and a small computer systems interface (SCSI) bus.

The computer 500 may interact with input/output devices via i/o interfaces 518 and input/output ports 510. Input/output devices can include, but are not limited to, a keyboard, a microphone, a pointing and selection device, cameras, video cards, displays, disk 506, network devices 520, and the like. The input/output ports 510 can include but are not limited to, serial ports, parallel ports, and USB ports.

The computer 500 can operate in a network environment and thus may be connected to network devices 520 via the i/o interfaces 518, and/or the i/o ports 510. Through the network devices 520, the computer 500 may interact with a network. Through the network, the computer 500 may be logically connected to remote computers. The networks with which the computer 500 may interact include, but are not limited to, a local area network (LAN), a wide area network (WAN), and other networks. The network devices 520 can connect to LAN technologies including, but not limited to, fiber distributed data interface (FDDI), copper distributed data interface (CDDI), Ethernet (IEEE 802.3), token ring (IEEE 802.5), wireless computer communication (IEEE 802.11), Bluetooth (IEEE 802.15.1), Zigbee (IEEE 802.15.4) and the like. Similarly, the network devices 520 can connect to WAN technologies including, but not limited to, point to point links, circuit switching networks like integrated services digital networks (ISDN), packet switching networks, and digital subscriber lines (DSL).

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Additional advantages and modifications will readily appear to those skilled in the art. Therefore, the invention is not limited to the specific details, the representative apparatus, and illustrative examples shown and described. Thus, this application is intended to embrace alterations, modifications, and variations that fall within the scope of the appended claims. Furthermore, the preceding description is not meant to limit the scope of the invention. Rather, the scope of the invention is to be determined by the appended claims and their equivalents.

To the extent that the term "includes" or "including" is employed in the detailed description or the claims, it is intended to be inclusive in a manner similar to the term "comprising" as that term is interpreted when employed as a transitional word in a claim. Furthermore, to the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

What is claimed is:

1. A system, comprising:
   a locked loop logic configured to process a received reference signal into a set of N signals with mutually exclusive phases and to provide the set of N signals to a selection logic;
   a state logic configured to store a first frequency divisor associated with a first signal selected by the selection logic as a current output signal and to store a second frequency divisor associated with a second signal selected by the selection logic as a next output signal; and
   a phase logic configured to store a current phase shift data associated with the current output signal and to determine a next phase shift data for selecting the next output signal based, at least in part, on the second frequency divisor and the current phase shift data, where switching from the current output signal to the next output signal changes the output signal frequency.

2. The system of claim 1, where a signal Sn that is a member of the set of N signals is phase shifted by (n/N) of a cycle from the received reference signal, N and n being integers, and n having a range of 0 to (N−1).

3. The system of claim 2, where N=64.

4. The system of claim 1, where the system has a lock time of one cycle of the reference signal.

5. The system of claim 4, where the lock time is less than 1 nanosecond.

6. The system of claim 1, where the phase logic determines the next phase shift data according to:

$$\text{Phase}(t+1) = \text{Phase}(t) + M$$

where t is a clock phase number, Phase (t) is a current output signal phase, Phase (t+1) is a next output signal phase, and M is the second frequency divisor.

7. The system of claim 6, where the selection logic is a multiplexer, and where the phase logic is configured to control the multiplexer to provide an output signal with a frequency corresponding to:

$$F_{out} = F_{max} * (N/(N+m))$$

where Fout is the current output signal provided by the selection logic, Fmax is the frequency of the received reference signal, N is the number of signals into which the reference signal is divided, and m is the first frequency divisor, m being an integer in the range 0 to (N−1).

8. The system of claim 1, including a control logic configured to receive a frequency divisor control signal configured to establish a value for the first frequency divisor.

9. The system of claim 8, where the frequency divisor control signal is a divisor up/down signal.

10. The system of claim 8, where the frequency divisor control signal is a discrete divisor signal.

11. The system of claim 1, including a computer configured with the locked loop logic, the phase logic, and the state logic.

12. A method, comprising:
   receiving a first clock signal;
   generating a set of N second signals from the first clock signal by processing the first clock signal into divided down signals having mutually exclusive phases, N being an integer;
   selecting one of the N second signals to provide as an output clock signal; and
   digitally controlling a clock output signal logic to change within a time period not greater than one cycle of the first clock signal, from providing a first output clock signal derived from a member of the set of N second signals to providing a second output clock signal derived from the set of N second signals, where changing from the first output clock signal to the second output clock signal changes the frequency of the provided output clock signal, where the phase of the provided output clock signal is determined by:

$$\text{Phase}(t+1) = \text{Phase}(t) + M$$

where t is a phase number of the current provided output clock signal, Phase (t) is a signal phase of the current provided output clock signal, Phase (t+1) is a signal phase of the next provided output clock signal, and M is a frequency divisor, M being an integer in the range 0 to (N−1).

13. A method for responding to a supply voltage change within one clock cycle of a reference clock whose frequency is related to the supply voltage, comprising:
   receiving a reference clock signal with a frequency Fmax from the reference clock;
   generating N different signals from the reference clock signal using a phase multiplexing technique, where each of the N different signals is phase shifted by (n/N) of a cycle from the phase of the reference clock signal, where N and n are integers, n being in the range 0 to (N−1);
   receiving a first control signal configured to establish an initial frequency divisor m that facilitates providing a first output clock signal with a first frequency;
   providing the first output clock signal where the first frequency is characterized by Fout=Fmax*(N/(N+m)), m being an integer in the range 0 to (N−1);
   tracking the frequency divisor m;
   tracking a phase of the output clock signal;
   receiving a second control signal configured to establish a second frequency divisor m' that facilitates providing a second output clock signal with a second frequency of Fout=Fmax*(N/N+m')) and where the second frequency divisor facilitates producing the second output clock signal by shifting to a second input signal from the N different signals, where the second input signal has a phase shift determined according to Ph(t+1)=Phase(t)+m'; and
   digitally controlling an output clock signal provider to switch to providing the second output clock signal in a single cycle of the reference clock signal.

14. A computer-readable medium storing processor executable instructions operable to perform a method for responding to a supply voltage change within one clock cycle of a clock whose frequency is related to the supply voltage, the method comprising:
   receiving a reference clock signal with a frequency Fmax from the reference clock;
   generating N different signals from the reference clock signal using a phase multiplexing technique, where each of the N different signals is phase shifted by (n/N) of a cycle from the phase of the reference clock signal, where N and n are integers, n being in the range 0 to (N−1);
   receiving a first control signal configured to establish an initial frequency divisor m that facilitates providing a first output clock signal with a first frequency;
   providing the first output clock signal where the first frequency is characterized by Fout=Fmax*(N/(N+m)), m being an integer in the range 0 to (N−1);
   tracking the frequency divisor m;
   tracking a phase of the output clock signal;
   receiving a second control signal configured to establish a second frequency divisor m' that facilitates providing a second output clock signal with a second frequency of Fout=Fmax*(N/N+m')) and where the second frequency divisor facilitates producing the second output clock signal by shifting to a second input signal from the N different signals, where the second input signal has a phase shift determined according to Ph(t+1)=Phase(t)+m'; and
   digitally controlling an output clock signal provider to switch to providing the second output clock signal in a single cycle of the reference clock signal.

* * * * *

UNITED STATES PATENT AND TRADEMARK OFFICE
CERTIFICATE OF CORRECTION

PATENT NO. : 7,068,081 B2
APPLICATION NO. : 10/838395
DATED : June 27, 2006
INVENTOR(S) : Samuel David Naffziger et al.

It is certified that error appears in the above-identified patent and that said Letters Patent is hereby corrected as shown below:

In column 8, line 8, delete "Fmax*(N/N+m'))." and insert -- Fmax*(N/(N+m')). --, therefor.

In column 10, line 55, in Claim 6, delete "Phase(t+l=Phase(t)+M" and insert -- Phase(t+l)=Phase(t)+M --, therefor.

In column 11, line 22, in Claim 12, delete "change" and insert -- change, --, therefor.

In column 12, line 9, in Claim 13, delete "Fmax*(N/N+m'))" and insert -- Fmax*(N/(N+m')) --, therefor.

In column 12, line 43, in Claim 14, delete "Fmax*(N/N+m'))" and insert -- Fmax*(N/(N+m')) --, therefor.

Signed and Sealed this

Fourteenth Day of April, 2009

JOHN DOLL
*Acting Director of the United States Patent and Trademark Office*